United States Patent
Yang et al.

(10) Patent No.: US 6,946,911 B2
(45) Date of Patent: Sep. 20, 2005

(54) TEMPERATURE-INSENSITIVE BIAS CIRCUIT FOR HIGH-POWER AMPLIFIERS

(75) Inventors: Youngoo Yang, Thousand Oaks, CA (US); Kevin Choi, Thousand Oaks, CA (US); Nai-Shuo Cheng, Simi Valley, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 28 days.

(21) Appl. No.: 10/637,146

(22) Filed: Aug. 8, 2003

(65) Prior Publication Data

US 2005/0030105 A1 Feb. 10, 2005

(51) Int. Cl.$^7$ ................................................ H03F 3/04
(52) U.S. Cl. ....................................... 330/296; 330/285
(58) Field of Search ................................ 330/261, 267, 330/273, 285, 288, 289, 296

(56) References Cited

U.S. PATENT DOCUMENTS 6,331,799 B1 * 12/2001 Miyazawa ................... 327/538
6,556,082 B1 * 4/2003 Wang et al. ................. 330/296

* cited by examiner

Primary Examiner—Khanh V. Nguyen
(74) Attorney, Agent, or Firm—Farjami & Farjami LLP

(57) ABSTRACT

An exemplary bias circuit is coupled to an amplifier. The bias circuit comprises a first bipolar transistor, a second bipolar transistor and a third bipolar transistor. The first bipolar transistor has a base connected to a first node, and the first node is connected to a reference voltage through a first resistor. The second bipolar transistor has a base connected to the first node. The third bipolar transistor has a collector connected to the first node and a base connected to an emitter of the first bipolar transistor at a second node. An emitter of the second bipolar transistor is connected to a base of a fourth bipolar transistor associated with the amplifier, and the second bipolar transistor does not have a resistor connected to the emitter of the second bipolar transistor.

22 Claims, 5 Drawing Sheets

TEMPERATURE-INSENSITIVE BIAS CIRCUIT FOR HIGH-POWER AMPLIFIERS

BACKGROUND OF THE INVENTION

1. Field of the Invention

The present invention is generally in the field of semiconductors. More specifically, the invention is in the field of semiconductor circuits.

2. Related Art

Amplifiers based on bipolar technology are widely used in a variety of applications, including wireless communication, such as radio frequency ("RF") communication, for example. Bias circuits perform an important function by supplying the base bias current to the bipolar transistor for controlling the operation modes of the bipolar transistor.

Currently known bias circuits for bipolar transistors, however, include a number of disadvantages. In general, known bias circuits consume large current and require a high reference voltage, or otherwise comprise very complex circuits which consume large die area, all of which are undesirable. Moreover, known bias circuits generally suffer from being temperature sensitive such that the quiescent current of the amplifier's transistor is subject to temperature variations.

Accordingly, there is a strong need in the art for an area efficient, temperature-insensitive bias circuit for high-power amplifiers.

SUMMARY OF THE INVENTION

The present invention is directed to an area efficient, temperature-insensitive bias circuit for high-power amplifiers, in one exemplary embodiment, a bias circuit is coupled to an amplifier, such as an RF amplifier, and comprises a first bipolar transistor, a second bipolar transistor and a third bipolar transistor. The first bipolar transistor has a base connected to a first node, and the first node is connected to a reference voltage through a first resistor. The second bipolar transistor has a base connected to the first node. The third bipolar transistor has a collector connected to the first node and a base connected to an emitter of the first bipolar transistor at a second node. An emitter of the second bipolar transistor is connected to a base of a fourth bipolar transistor associated with the amplifier, and the second bipolar transistor does not have a resistor connected to the emitter of the second bipolar transistor.

As a result of the above arrangement, an emitter size ratio of the first bipolar transistor to the second bipolar transistor is independent of an emitter size ratio of the third bipolar transistor to the fourth bipolar transistor, thereby allowing the die area consumed by the transistors of the bias circuit to be significantly reduced.

In one embodiment, the bias circuit further comprises a control circuit connected to the second node, wherein the control circuit draws an increased current during a high mode operation and draws a reduced current during a low mode operation. For example, the control circuit may have a reduced resistance during the high mode operation and an increased resistance during the low mode operation. According to one particular embodiment, the control circuit comprises a fifth bipolar transistor having a collector connected to the second node through a second resistor and to ground through a third resistor. An emitter of the fifth bipolar transistor is coupled to ground, and a base of the fifth bipolar transistor is connected to a control voltage through a fourth resistor. As discussed below, this particular arrangement results in an amplifier quiescent current which is significantly insensitive to temperature variations.

According to another embodiment, the bias circuit further comprises a high-temperature gain compensation circuit connected in parallel with the first resistor and is configured to draw current at high temperatures. According to one particular embodiment, the high-temperature gain compensation circuit comprises a second resistor and a Schottky diode, wherein a first end of the second resistor is connected to the reference voltage, a second end of the second resistor is connected to an anode of the Schottky diode, and a cathode of the Schottky diode is connected to the first node. As discussed below, this particular arrangement provides compensation for amplifier gain drop during high temperatures.

Other features and advantages of the present invention will become more readily apparent to those of ordinary skill in the art after reviewing the following detailed description and accompanying drawings.

DETAILED DESCRIPTION OF THE INVENTION

The present invention is directed to an area efficient, temperature-insensitive bias circuit for high-power amplifiers. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
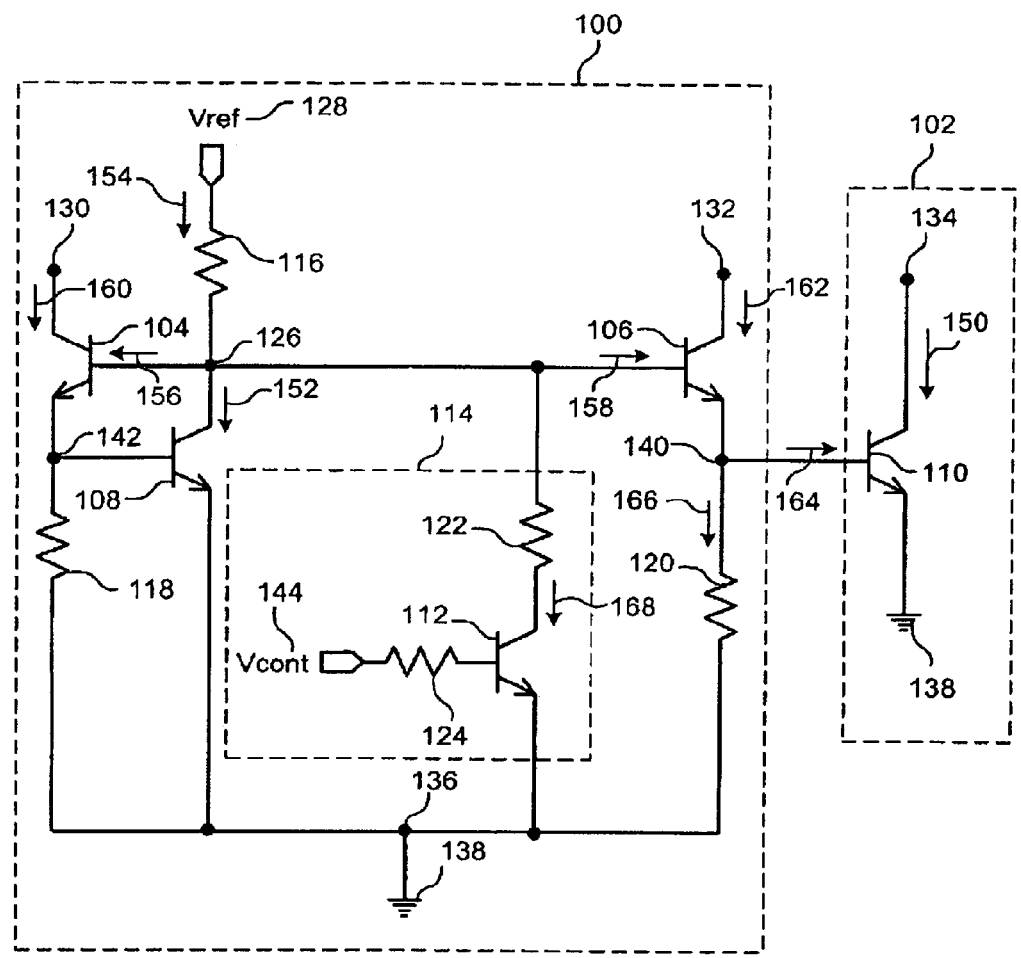
FIG. 1 shows a circuit diagram depicting a known bias circuit.

To illustrate the features and advantages of the present invention by way of contrast, a brief description of known bias circuit 100 in FIG. 1 is provided. Referring to FIG. 1, there is shown a circuit diagram depicting known bias circuit 100 coupled to amplifier 102. Known bias circuit 100 includes bipolar transistors 104, 106 and 108, resistors 116, 118 and 120, and control circuit 114.

One end of resistor 116 is connected to reference voltage ("Vref") 128, and the other end of resistor 116 is connected to node 126. The base of transistor 104, the base of transistor 106 and the collector of transistor 108 are coupled to node 126. The emitter of transistor 104 is connected to the base of transistor 108 and to ground 138 at node 136 through resistor 118. The emitter of transistor 108 is also connected to ground 138 at node 136. The emitter of transistor 106 at node 140 is also coupled to ground 138 through shunt resistor 120.

Amplifier 102 includes bipolar transistor 110 having a base coupled to node 140 of known bias circuit 100, and an emitter coupled to ground 138. Control circuit 114 includes bipolar transistor 112 having a collector coupled to node 126 through resistor 122. The base of transistor 112 is coupled to control voltage ("Vcont") 144 through resistor 124, and the emitter of transistor 112 coupled to ground 138 at node 136. Nodes 130, 132 and 134 may be connected to a bias voltage or may be directly connected to a supply voltage ("VCC"), as is known in the art.

With the arrangement as shown in FIG. 1, collector current 150 of transistor 110 represents the quiescent current ("Icq") of transistor 110. In order to produce collector current 150 having a magnitude N times that of collector current 152 of transistor 108, the ratios between the following elements are required: the emitter size of transistor 106 is N times larger than the emitter size of transistor 104; the emitter size of transistor 110 is N times larger than the emitter size of transistor 108; the value of resistor 118 is N times greater than the value of resistor 120, where N is an arbitrary integer. As a result, the magnitude of collector current 162 of transistor 106 will be N times the magnitude of collector current 160 of transistor 104, and the magnitude of collector current 150 of transistor 110 will be N times the magnitude of collector current 152 of transistor 108.

However, a number of disadvantages are associated with bias circuit 100. High power devices necessitate a large N value, thereby requiring the emitter size of transistor 106 to be substantially large in order to maintain a size N times greater than the emitter size of transistor 104. As a consequence, large die area is consumed by transistor 106, which is undesirable for many applications. On the other hand, if the emitter size ratio of transistor 108 to transistor 110 were decreased in order to reduce the die area consumed by transistor 108, large reference current ("Iref") 154 is drawn through resistor 116 as a result of large collector current 152 drawn by transistor 108, resulting in significant power consumption trade-off as a result of reducing the size of transistor 108. As is known in the art, a high Iref is undesirable.

Continuing with FIG. 1, control circuit 114 can be configured to control bias circuit 100 for low output power mode by supplying Vcont 144 to turn on transistor 112. During this low output power mode, current 168 is drawn by transistor 112, and voltage at node 126 is decreased, thereby reducing collector current 152 drawn by transistor 108. As a consequence of reducing collector current 152 from Iref 154, the temperature tracking capability of bias circuit 100 is significantly reduced, and consequently Icq 150 become sensitive to variations in temperature, which as discussed above, is undesirable.

Figure 2:
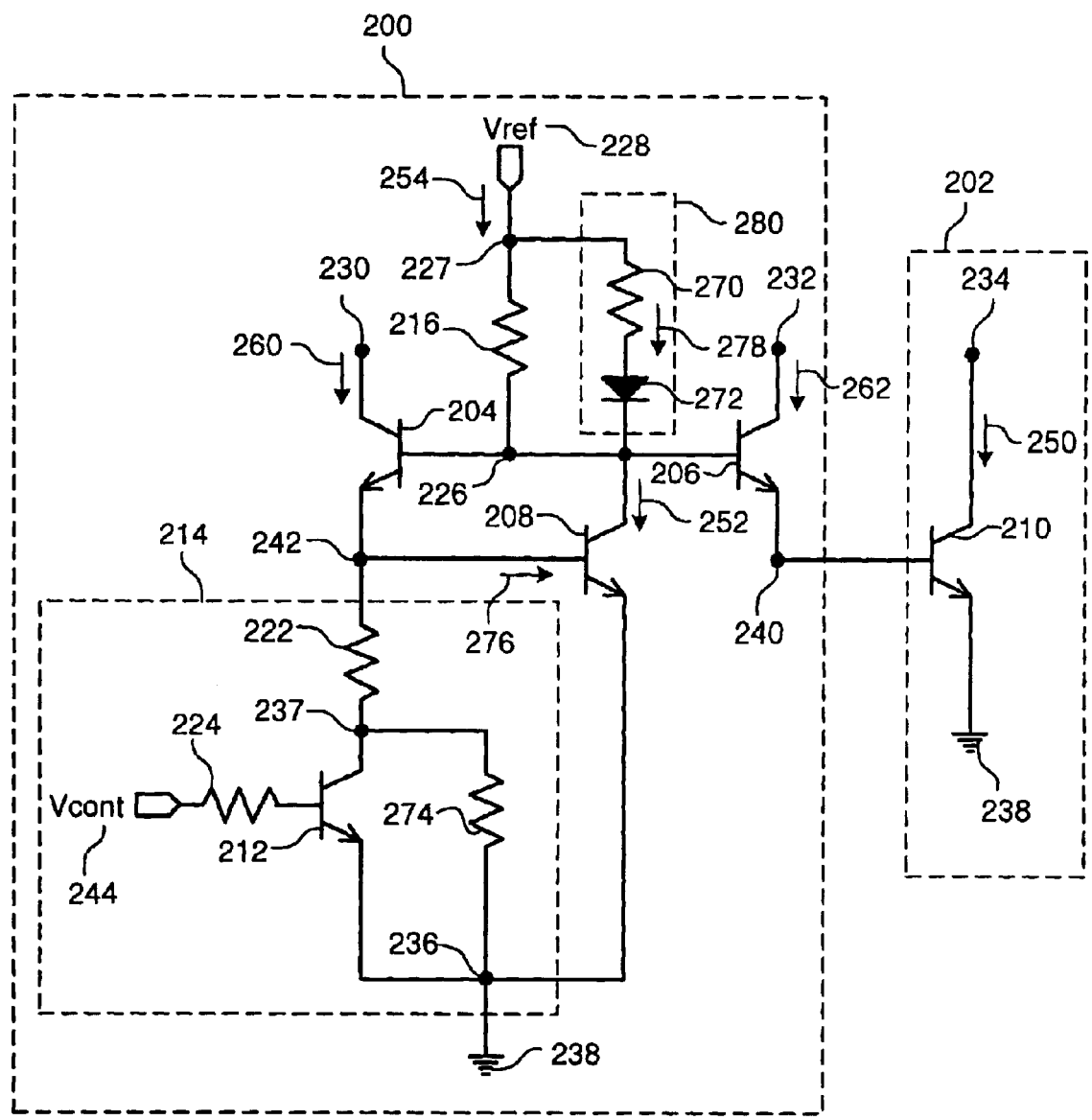
FIG. 2 shows a circuit diagram of an exemplary bias circuit for an RF amplifier according to one embodiment of the present invention.

Referring now to FIG. 2, there is shown exemplary bias circuit 200 in accordance with one embodiment of the present invention. In FIG. 2, bias circuit 200 is shown coupled to amplifier 202, which may be employed in a number of applications, such as RF communication, for example. As discussed in greater detail below, bias circuit 200 results in significantly reduced Vref 228 and Iref 254 while generating Icq 250 which is largely insensitive to temperature variations. Moreover, due to the particular arrangement of bias circuit 200, the die area consumed by bias circuit 200 is significantly reduced.

In FIG. 2, bias circuit 200 comprises bipolar transistors 204, 206 and 208, resistor 216, control circuit 214 and high-temperature gain compensation circuit 280. Reference Voltage ("Vref") 228 is supplied to node 227 of bias circuit 200, and resistor 216 is connected across nodes 226 and 227. As shown in FIG. 2, high-temperature gain compensation circuit 280 is connected in parallel with resistor 216 across nodes 226 and 227. More particularly, one end of resistor 270 is connected to node 276 and the other end of resistor 270 is connected to the anode of Schottky diode 272. The cathode of Schottky diode 272 is connected to node 226.

The base of transistor 204, the base of transistor 206 and the collector of transistor 208 are coupled to node 226. The emitter of transistor 208 is connected to ground 238 at node 236, and the emitter of transistor 206 is connected to amplifier 202 at node 240, and is not connected to ground through a shunt resistor. The emitter of transistor 204 is coupled at node 242 to the base of transistor 208 and to control circuit 214. Control circuit 214 comprises transistor 212 and resistors 222, 224 and 274, where the collector at node 237 of transistor 212 is connected to node 242 through resistor 222, the emitter of transistor 212 is connected to ground 238 at node 236, and the base of transistor 212 is coupled to control voltage ("Vcont") 244 through resistor 224. Resistor 274 of control circuit 214 is also connected across nodes 236 and 237 as shown in FIG. 2.

Amplifier 202 includes bipolar transistor 210, which may be a high-power transistor, having a base coupled to node 240 of bias circuit 200, and an emitter coupled to ground 238. Nodes 230, 232 and 234 may be connected to a bias voltage or may be directly connected to VCC.

Figure 3:
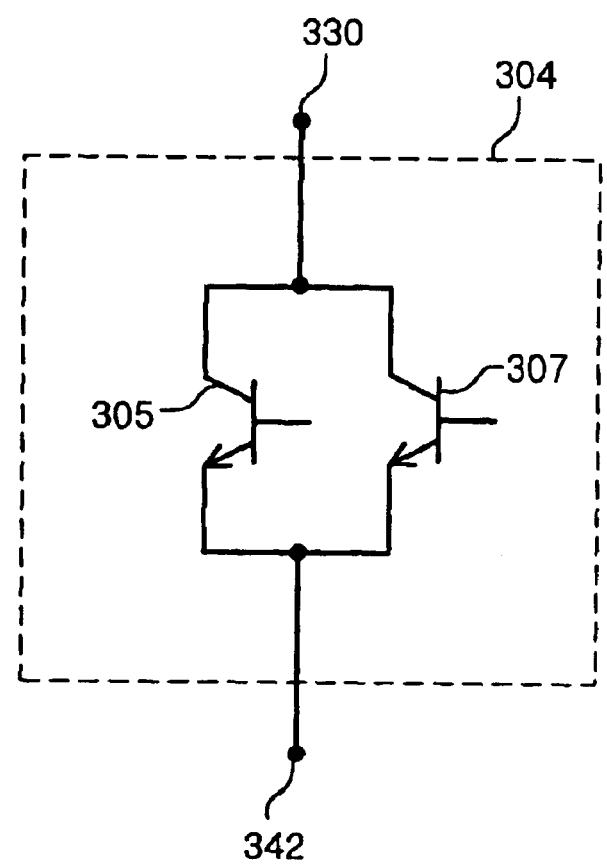
FIG. 3 shows a circuit diagram depicting an operational equivalent circuit of a portion of the bias circuit of FIG. 2 according to one embodiment of the present invention.

Since a shunt resistor is not connected between the emitter of transistor 206 and ground 238, the size of transistor 206 can be reduced. In operation, transistor 204 can be represented by transistors 305 and 307 in circuit block 304 of FIG. 3, where nodes 330 and 342 respectively correspond to nodes 230 and 242 in FIG. 2. Accordingly, resistor 222 and/or resistor 274 of control circuit 214 may be used to dissipate current from transistor 305, which is a virtually divided part of transistor 204. With this arrangement, an arbitrary emitter size ratio of transistor 204 to transistor 206 can be achieved while maintaining a 1:N emitter size ratio of transistor 208 to transistor 210, thereby allowing the emitter area of transistor 206 to be further reduced. The ratios between the following elements are provided by the arrangement of bias circuit 200: the emitter size of transistor 210 is N times larger than the emitter size of transistor 208; the emitter size of transistor 204: the emitter size of transistor 305: the emitter size of transistor 307: the emitter size of transistor 206 is equal to 1: (N−M)/N:M/N:M, where M is a number less than N and does not have to be an integer. For Icq 250 to be N times collector current 252 of transistor 208, a value "R2" defined by Equation 1 can be used to represent the effective resistance of control circuit 214 and is defined by the following formula:

$$R2 = \frac{M \cdot Vt \cdot n3 \cdot \ln\left(\frac{Ib3}{Is3}\right)}{Ib3 \cdot (N-M)} \quad \text{Equation 1}$$

where n3 is an ideality factor of forward base current for transistor 208, Is3 is a reverse saturation current of transistor 208, and Ib3 is base current 276 of transistor 208 given by the following formula:

$$Ib3 = Is3 \cdot \exp\left(\frac{Vbe3}{n3 \cdot Vt}\right) \quad \text{Equation 2}$$

where Vbe3 is the base-to-emitter voltage of transistor 208.

With this arrangement, collector current 262 of transistor 206 is M times greater than collector current 260 of transistor 204, and collector current 250 of transistor 210 is N times greater than collector current 252 of transistor 208. As discussed above, the particular arrangement of bias circuit 200 allows the emitter size ratio of transistors 208 to transistor 210 to be independent from the emitter size ratio of transistors 204 to transistor 206, therefore allowing the overall area of the bias transistors 204, 206 and 208 to be reduced.

Another advantage of bias circuit 200 is that Iref 254 can be significantly reduced while achieving a reduced size of transistor 206, and without a shunt resistor connected between the emitter of transistor 206 and ground 238. As a further benefit of reduced Iref 254, Vref 228 is also reduced since voltage drop across resistor 216 is lowered by reduced Iref 254.

Control circuit 214 can be configured for "high mode" operation or "low mode" operation. Vcont 244 provides a high signal to activate transistor 212 for high mode operation or a low signal to disable transistor 212 for low mode operation. In high mode operation, transistor 212 is turned on, and the resistance of control circuit 214 is reduced and corresponds to the resistance of resistor 222. Due to the reduced resistance of, and the corresponding increased current drawn by, control circuit 214, base current 276 available for the base of transistor 208 is reduced which in turn causes collector current 252 of transistor 208 to decrease. Decreased collector current 252 of transistor 208 results in an increase in the respective base currents of transistors 206 and 210 and thus results in an increased Icq 250.

In low mode operation, transistor 212 is turned off, and the resistance of control circuit 214 is increased and corresponds to the total resistance of resistors 222 and 274. Due to the increased resistance of, and the corresponding decreased current drawn by, control circuit 214, base current 276 available for the base of transistor 208 is increased which in turn causes collector current 252 of transistor 208 to increase. Increased collector current 252 of transistor 208 results in a decrease in the respective base currents of transistors 206 and 210 and thus results in a reduced Icq 250.

Thus, although transitions between low mode operation and high mode operation can break the 1:N ratio of collector current 252 of transistor 208 to collector current 250 of transistor 210, current 250 is still tracked by current 252 with a certain ratio. Therefore, quiescent current variation with temperature caused by operation mode control can be significantly suppressed.

Figure 4:
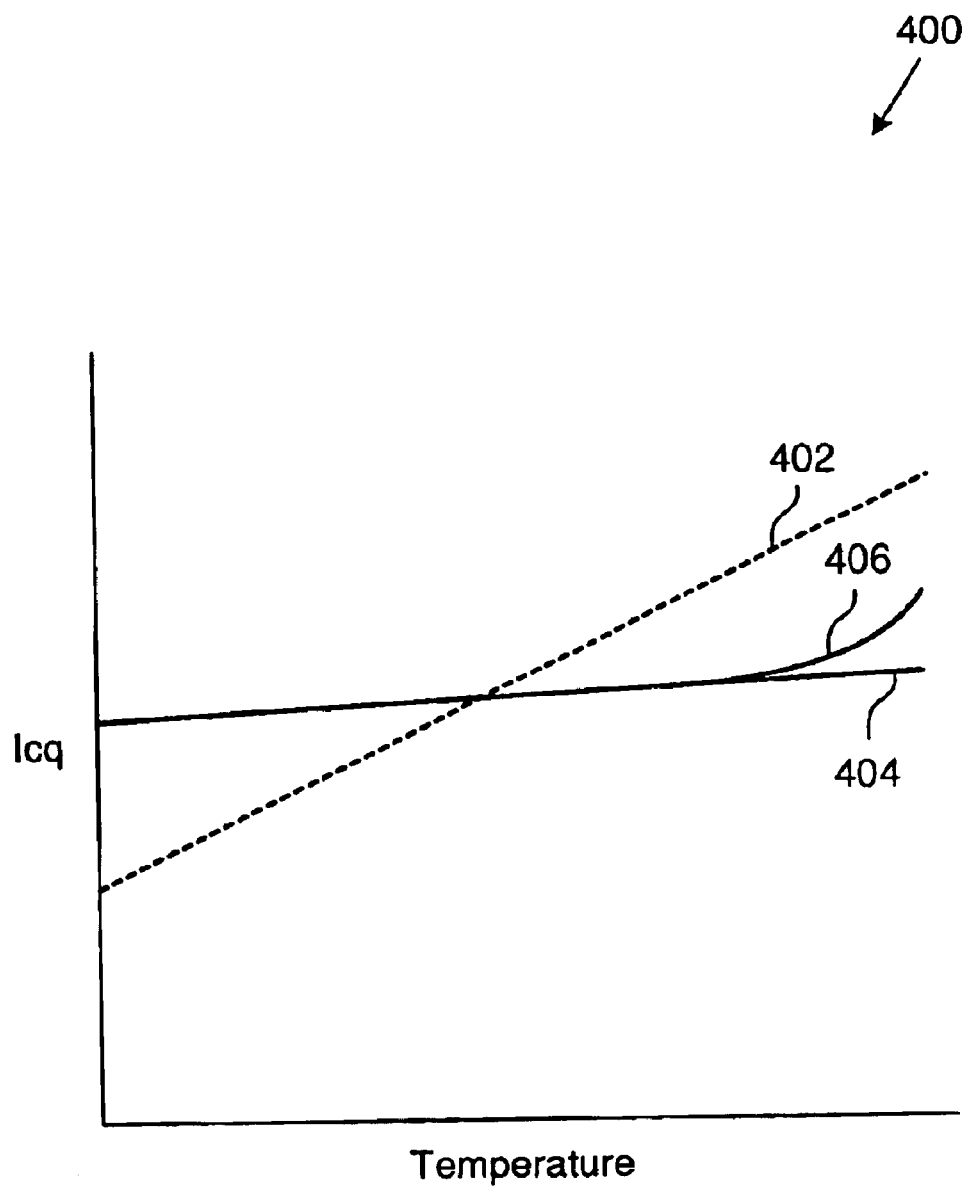
FIG. 4 is a graph depicting quiescent current characteristics over temperature achieved by bias circuits according to various embodiments.

With reference to graph 400 of FIG. 4, graph 400 illustrates quiescent current variations over temperature achieved by bias circuits according to various embodiments. For example, curve 402 illustrates the quiescent current variation over temperature of known bias circuit 100. Since curve 402 has a steep slope, Icq of known bias circuit 100 exhibits high sensitivity to temperature variations. Curve 404 illustrates the quiescent current variation over temperature of known bias circuit 200 without high temperature gain compensation circuit 280, and curve 406 illustrates the quiescent current variation over temperature of known bias circuit 200 with high temperature gain compensation circuit 280. Curves 404 and 406, each of which has a relatively flat slope, corresponds to Icq of known bias circuit 200 being substantially insensitive to temperature variations.

Curve 406 illustrates that high temperature gain compensation circuit 280 of bias circuit 200 provides compensation for gain drop at high temperatures. At high temperatures, transistor 208 consumes larger current, which causes a voltage drop at node 226. As the voltage difference between Vref 228 and the voltage at node 226 become larger, Schottky diode 272 gradually turns on drawing current 278, which increases Iref 254. As a result of increased Iref 254, Icq 250 of transistor 210 is also increased, thereby providing enhanced power gain of amplifier 202.

Figure 5:
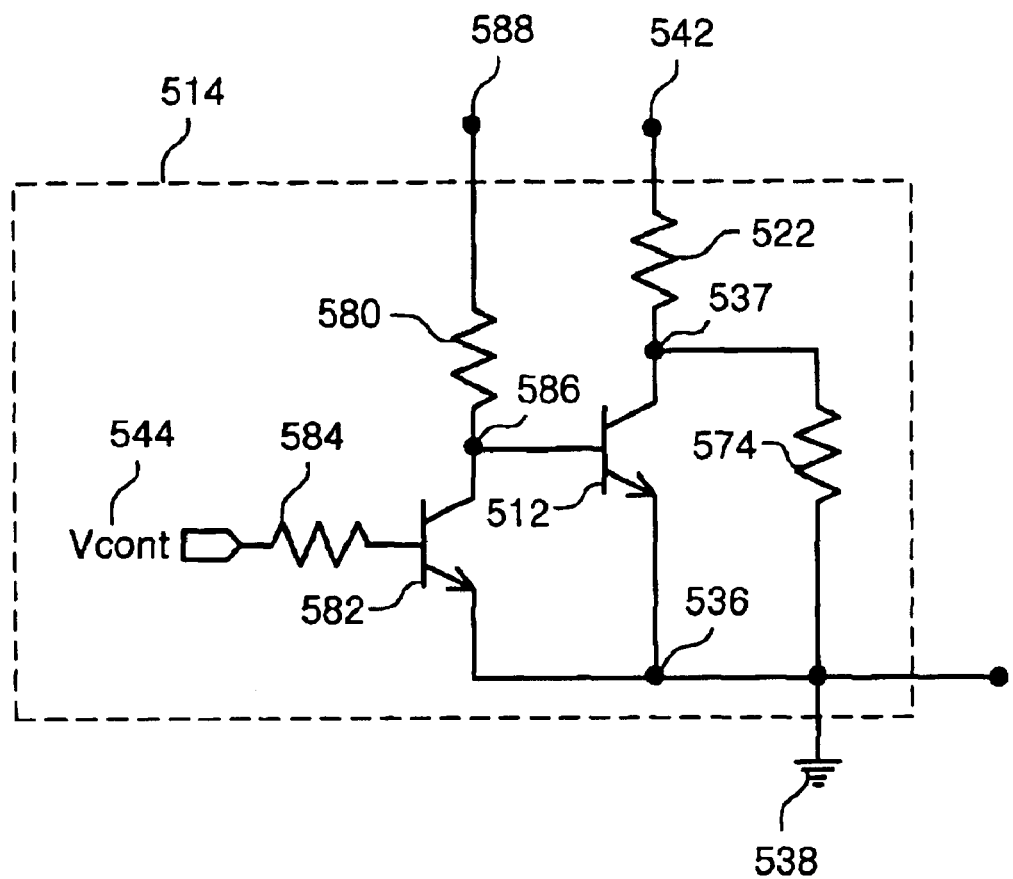
FIG. 5 shows a circuit diagram of an exemplary control circuit according to one embodiment of the present invention.

FIG. 5 illustrate alternative control circuit 514 which may be used to replace control circuit 214 of FIG. 2 according to one embodiment, such that Vcont 544 provides a high signal for low mode operation and a low signal for high mode operation. Control circuit 514 comprises transistors 512 and 582, and resistors 522, 574, 580 and 584, where transistor 512, resistors 522 and 574, and nodes 542, 537 and 536 respectively correspond to transistor 212, resistors 222 and 274, and nodes 242, 237 and 236 in FIG. 2. The collector of transistor 282 is connected at node 586 to the base of transistor 512, and the emitter of transistor 282 is coupled to ground 538 at node 536. Resistor 580 is connected across nodes 588 and 586, where node 588 may be connected to a bias voltage or may be directly connected to VCC. The base of transistor 582 is coupled to Vcont 544 through resistor 584, such than transistor 582 is turned on and transistor 512 is turned off during low mode operation, and transistor 582 is turned off and transistor 512 is turned on during high mode operation.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, an area efficient, temperature-insensitive bias circuit for high-power amplifiers has been described.

What is claimed is:

1. A bias circuit for an amplifier, said bias circuit comprising:

a first bipolar transistor having a base connected to a first node, said first node connected to a reference voltage through a first resistor;

a second bipolar transistor having a base connected to said first node;

a third bipolar transistor having a collector connected to said first node and a base connected to an emitter of said first bipolar transistor at a second node, an emitter of said second bipolar transistor being connected to a base of a fourth bipolar transistor associated with said amplifier, said bias circuit being connected to a control circuit at said second node.

2. The bias circuit of claim 1, wherein an emitter size ratio of said first bipolar transistor to said second bipolar transistor is independent of an emitter size ratio of said third bipolar transistor to said fourth bipolar transistor.

3. The bias circuit of claim 1, wherein said control circuit drawing an increased current during a high mode operation and drawing a reduced current during a low mode operation.

4. The bias circuit of claim 3, wherein said control circuit has a reduced resistance during said high mode operation and an increased resistance during said low mode operation.

5. The bias circuit of claim 3, wherein said control circuit comprises a fifth bipolar transistor having a collector connected to said second node through a second resistor and to ground through a third resistor, an emitter of said fifth bipolar transistor being coupled to ground, and a base of said fifth bipolar transistor connected to a control voltage through a fourth resistor.

6. The bias circuit of claim 1, further comprising a high-temperature gain compensation circuit connected in parallel with said first resistor, said high-temperature gain compensation circuit configured to draw current at high temperatures.

7. The bias circuit of claim 6, wherein said high-temperature gain compensation circuit comprises a second resistor and a Schottky diode, wherein a first end of said second resistor is connected to said reference voltage, a second end of said second resistor being connected to an anode of said Schottky diode, and a cathode of said Schottky diode being connected to said first node.

8. The bias circuit of claim 1, wherein said second bipolar transistor does not have a resistor connected to said emitter of said second bipolar transistor.

9. A control circuit for the operation of a bias circuit, said bias circuit including a first bipolar transistor, a second bipolar transistor, and a third bipolar transistor, said first bipolar transistor having a base connected to a base of said second bipolar transistor at a first node, said first node connected to a reference voltage through a first resistor, said third bipolar transistor having a collector connected to said first node and a base connected to an emitter of said first bipolar transistor at a second node, an emitter of said second bipolar transistor being connected to a base of a fourth bipolar transistor, said control circuit comprising:

a fifth bipolar transistor having a collector connected to said second node through a second resistor and to ground through a third resistor, an emitter of said fifth bipolar transistor being coupled to ground, and a base of said fifth bipolar transistor connected to a control voltage through a fourth resistor.

10. The control circuit of claim 9, wherein said control circuit draws an increased current during a high mode operation and draws a reduced current during a low mode operation.

11. The control circuit of claim 10, wherein during said high mode operation, said control circuit has said total resistance equivalent to said second resistor.

12. The control circuit of claim 10, wherein during said low mode operation, said control circuit has a total resistance equivalent to the sum of said second resistor and said third resistor.

13. The control circuit of claim 10, wherein said fifth bipolar transistor is deactivated during said low mode operation, and said fifth bipolar transistor is activated during said high mode operation.

14. The control circuit of claim 9, wherein said second bipolar transistor does not have a resistor connected to said emitter of said second bipolar transistor.

15. An amplifier circuit comprising:

a bias circuit including a first bipolar transistor, a second bipolar transistor, and a third bipolar transistor, said first bipolar transistor having a base connected to a base of said second bipolar transistor at a first node, said first node connected to a reference voltage through a first resistor, said third bipolar transistor having a collector connected to said first node and a base connected to an emitter of said first bipolar transistor at a second node, said bias circuit being connected to a control circuit at said second node, an amplifier including a fourth bipolar transistor having a base connected to an emitter of said second bipolar transistor, and an emitter coupled to ground.

16. The amplifier circuit of claim 15, wherein an emitter size ratio of said first bipolar transistor to said second bipolar transistor is independent of an emitter size ratio of said third bipolar transistor to said fourth bipolar transistor.

17. The amplifier circuit of claim 15, wherein said control circuit drawing an increased current during a high mode operation and drawing a reduced current during a low mode operation.

18. The amplifier circuit of claim 17, wherein said control circuit has a reduced resistance during said high mode operation and an increased resistance during said low mode operation.

19. The amplifier circuit of claim 17, wherein said control circuit comprises a fifth bipolar transistor having a collector connected to said second node through a second resistor and to ground through a third resistor, an emitter of said fifth bipolar transistor being coupled to ground, and a base of said fifth bipolar transistor connected to a control voltage through a fourth resistor.

20. The amplifier circuit of claim 15, further comprising a high-temperature gain compensation circuit connected in parallel with said first resistor, said high-temperature gain compensation circuit configured to draw current at high temperatures.

21. The amplifier circuit of claim 20, wherein said high-temperature gain compensation circuit comprises a second resistor and a Schottky diode, wherein a first end of said second resistor is connected to said reference voltage, a second end of said second resistor being connected to an anode of said Schottky diode, and a cathode of said Schottky diode being connected to said first node.

22. The amplifier circuit of claim 15, wherein said second bipolar transistor does not have a resistor connected to said emitter of said second bipolar transistor.

* * * * *